(12) United States Patent
Tomasini et al.

(10) Patent No.: US 6,448,839 B1
(45) Date of Patent: Sep. 10, 2002

(54) CIRCUIT FOR COMPENSATING FOR THE DIFFERENCE BETWEEN THE VGS VOLTAGES OF TWO MOS TRANSISTORS

(75) Inventors: Luciano Tomasini, Milan; Jesus Guinea, Bergamo, both of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/693,182

(22) Filed: Oct. 20, 2000

(51) Int. Cl.$^7$ ............................................... H03K 17/14
(52) U.S. Cl. ........................ 327/378; 327/362; 327/513
(58) Field of Search ................................ 327/362, 363, 327/378, 513

(56) References Cited

U.S. PATENT DOCUMENTS 5,365,063 A * 11/1994 Laot et al. .................. 330/298

FOREIGN PATENT DOCUMENTS

EP            0123275       10/1984       ............. H03F/3/45

OTHER PUBLICATIONS

Hogervorst R et al: "Compact CMOS Constant–GM Rail–to–Rail Input Stage With GM–Control by an Electronic Zener Diode" IEEE Journal of Solid–State Circuits, US, IEEE Inc. New York, vol. 31, No. 7, Jul. 1, 1996, pp. 1035–1040, XP000632391.

* cited by examiner

Primary Examiner—Tuan T. Lam
Assistant Examiner—Hiep Nguyen
(74) Attorney, Agent, or Firm—Lisa K. Jorgenson; Allen, Dyer, Doppelt, Milbrath & Gilchrist, P.A.

(57) ABSTRACT

The difference between the Vgs voltages of first and second MOS transistors of an integrated circuit due to variations in the production process and/or to variations of other parameters is compensated by a compensation circuit. The compensation circuit includes third and fourth MOS transistors that are the same type as the first and second transistors. These transistors are all formed in the same integrated circuit. The compensation circuit includes a bias circuit for biasing the third and fourth transistors, and a measurement circuit for measuring the difference between the Vgs voltages of the third and fourth transistors. The compensation circuit further includes a current compensation circuit for generating a compensation current that is a function of the difference measured, and a modification circuit for modifying the biasing of the first and second MOS transistor using the compensation current.

26 Claims, 2 Drawing Sheets

CIRCUIT FOR COMPENSATING FOR THE DIFFERENCE BETWEEN THE VGS VOLTAGES OF TWO MOS TRANSISTORS

FIELD OF THE INVENTION

The present invention relates to the field of integrated circuits, and, more particularly, to a circuit that compensates for the difference between the gate-source voltages (Vgs) of two MOS transistors of an integrated circuit. The present invention also applies to field-effect transistors of different types.

BACKGROUND OF THE INVENTION

MOS transistors are field-effect transistors produced by metal-oxide semiconductor (MOS) technology processes, and are commonly used as basic components for devices in analog and digital integrated circuits.

Characteristics of the components of integrated circuits vary relative to the design characteristics because of the variability of the production processes. MOS transistors of different types or dimensions formed in the same circuit may respond differently to process variations. In many applications, particularly in analog circuits, this different behavior of MOS transistors causes imbalances in the operation of the circuits, or undesired deviations from the operation provided for at the design stage.

An example of such an application is the input stage of an amplifier. As shown in FIG. 1, the input stage includes an n-channel transistor Mn and a p-channel transistor Mp having their source electrodes connected to the respective terminals of a voltage reference (ground and VDD), and their gate electrodes connected to respective biasing circuits. The biasing circuits include, in this example, two identical current generators Go respectively connected to an input node N of the input stage via a resistor Ro. The drain electrodes of the two transistors form two outputs of the input stage, and are connected to other components of the amplifier.

If the input stage is required to have a symmetrical response to an input signal applied to the input node N, the generators Go must generate identical currents, the resistors Ro must have the same resistance, and the voltages Vgsn and Vgsp between the gate electrodes and the source electrodes of the two transistors Mn and Mp must be identical. The first two conditions can be satisfied by sufficient precision, but the third cannot generally be satisfied because the two transistors are structurally different from one another. Therefore, they have different characteristic curves. Moreover, the two transistors respond differently to temperature variations during operation.

In this example, two complementary MOS transistors are considered, but similar problems also arise with the use of MOS transistor pairs that include both n-channel transistors or both p-channel transistors. These transistors have different dimensions or are biased such that different currents pass through them.

SUMMARY OF THE INVENTION

An object of the present invention is to provide a circuit which compensates for the difference between the gate-source voltages of two MOS transistors of different types due to variations in the production processes and/or to variations of other parameters, such as temperature.

This object is achieved using a compensation circuit for compensating a difference between gate-source voltages of first and second MOS transistors of an integrated circuit. The compensation circuit preferably comprises third and fourth MOS transistors in the integrated circuit and which are respectively a same type as the first and second MOS transistors. A bias circuit is preferably connected to the third and fourth MOS transistors for biasing thereof, and a measurement circuit measures a difference between gate-source voltages of the third and fourth transistors.

The compensation circuit preferably further includes a current compensation circuit connected to the measurement circuit for generating a compensation current based upon the measured difference between the gate-source voltages of the third and fourth transistors. A bias compensation circuit is preferably connected to the measurement circuit for modifying biasing of the first and second MOS transistors using the generated compensation current.

The integrated circuit also includes a voltage compensation circuit for generating a compensation voltage to add to or substrate from the gate-source voltages of the first and second MOS transistors so that respective drain currents are equal. The difference between gate-source voltages of the first and second MOS transistors are thus compensated to overcome variations in the production processes and/or to variations of other parameters, such as temperature. The first and third MOS transistors may be p-channel MOS transistors and the second and fourth MOS transistors may be n-channel MOS transistors.

BRIEF DESCRIPTION OF THE DRAWINGS

The invention will be better understood from the following detailed description of an embodiment thereof which is given by way of a non-limiting example with reference to the appended drawings, in which.

DETAILED DESCRIPTION OF THE PREFERRED EMBODIMENTS

Figure 1:
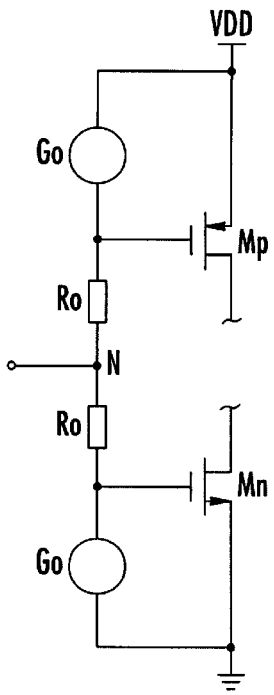
FIG. 1 is a simplified circuit diagram of an input stage of an amplifier according to the prior art.
Figure 2:
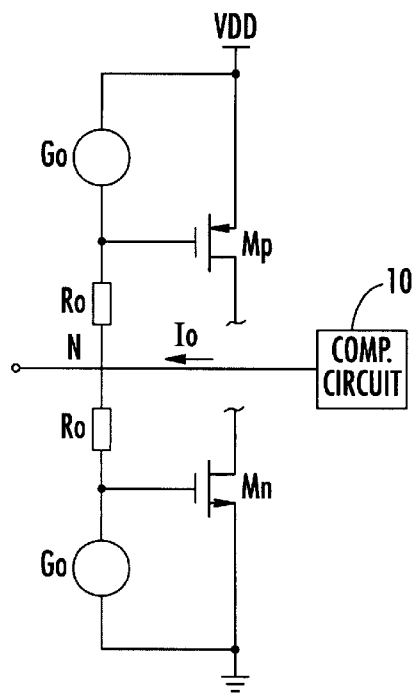
FIG. 2 is a diagram similar to that of FIG. 1 modified by the addition of a compensation circuit according to the present invention.

FIG. 2 shows schematically the amplifier input stage of FIG. 1, and includes a circuit for compensating for the difference between the voltages Vgsn and Vgsp. The compensation circuit is represented by block 10, and generates a compensation current Io which is injected into node N.

Figure 3:
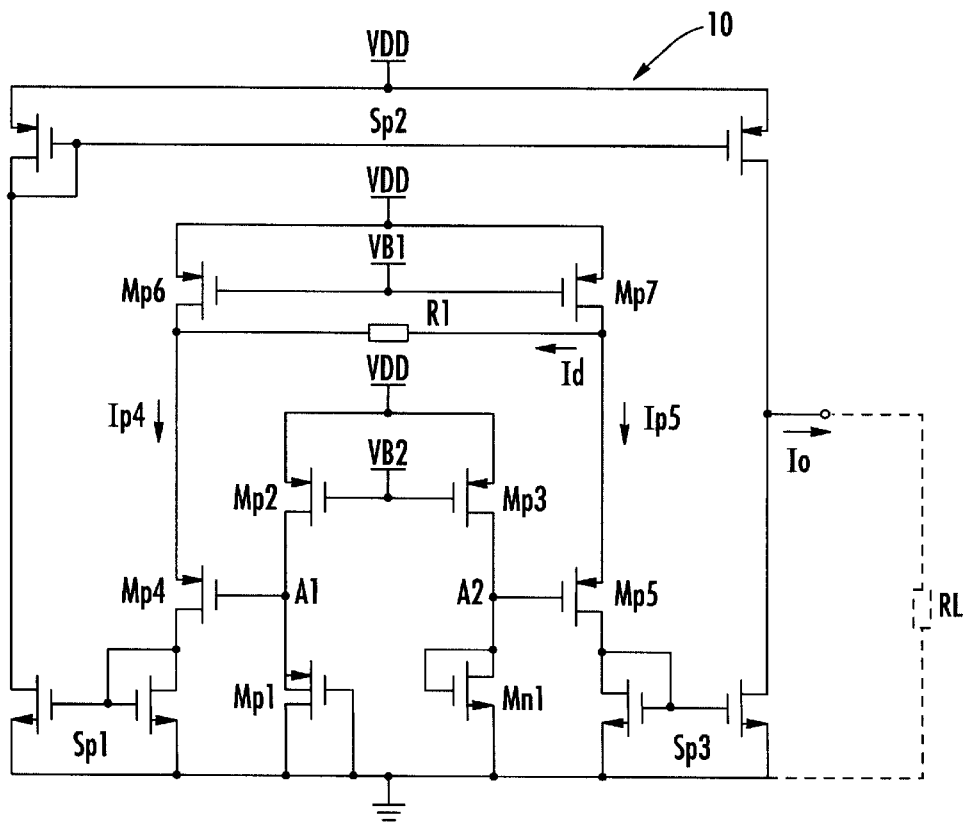
FIG. 3 is a diagram of a compensation circuit according to the present invention.

As can be seen in FIG. 3, the compensation circuit 10 comprises two MOS transistors, a p-channel transistor Mp1 and an n-channel transistor Mn1 which are of the same type as the transistors Mp and Mn of FIG. 2. That is, the transistors are manufactured in the same device and by the same process stages. In this embodiment, the transistors Mp1 and Mn1 respectively have the same dimensions as the transistors Mp and Mn. However, they could have different dimensions.

Each of the two transistors Mp1 and Mn1 has its gate and drain electrodes connected to one another. The transistors Mp1 and Mn1 are each connected between the voltage reference or supply terminals by a constant current generator. In this embodiment, the constant current generators are formed by two p-channel transistors Mp2 and Mp3 which have their source electrodes connected together to the terminal VDD. The gate electrodes are connected together to a terminal VB2 of a constant voltage supply. One of the transistors has its drain electrode connected to the source electrode of the transistor Mp1 at node A1, and the other transistor has its drain electrode connected to the drain electrode of the transistor Mn1 at node A2. The transistor Mp1 has its body region connected to its source electrode.

Each of the nodes A1 and A2 is connected to the input of a decoupling stage. The outputs of the decoupling stage are connected to one another by resistor R1. In this embodiment, the decoupling stages are formed by two p-channel MOS transistors Mp4 and Mp5 having their gate electrodes connected to nodes A1 and A2, respectively. Their source electrodes are connected to the terminal VDD via respective constant current generators, and their drain electrodes are connected to ground via the input branches of respective current mirrors Sp1 and Sp3.

The constant-current generators are formed, respectively, by two p-channel transistors Mp6 and Mp7 having their source electrodes connected together to terminal VDD, their gate electrodes connected together to terminal VB1 of a constant-voltage supply, and their drain electrodes connected to the source electrodes of the transistors Mp4 and Mp5, respectively. The output branches of the current mirrors Sp1 and Sp3 are in series with the input and output branches, respectively, of a further current mirror Sp2, as shown in FIG. 3.

The circuit combination comprising transistors Mp2 and Mp3 has the function of biasing the transistors Mp1 and Mn1. The circuit combination comprising the decoupling stages Mp4 and Mp5 and the respective current generators Mp6 and Mp7 has the function of measuring the difference between the gatesource voltages Vgsp and Vgsn of the two transistors Mp1 and Mn1.

The voltages of nodes A1 and A2 relative to ground, that is, voltages Vgsp and Vgsn, are reproduced substantially unchanged by the decoupling stages at the terminals of the resistor R1 so that a current Id proportional to the difference between the voltages Vgsn and Vgsp flows through this resistor.

Upon the assumption that all of the mirrors have a gain equal to 1, a current Io=2Id is supplied to a load RL. The load RL is shown in FIG. 3 using a dashed line connected between the output branches of the mirrors Sp2, Sp3 and ground. This can easily be confirmed based upon the following.

The current passing through the resistor R1 is Id=(Vgsn-Vgsp)/R1, where R1 is the resistance of the resistor R1. The currents Ip4 and Ip5 passing through the transistors Mp4 and Mp5, respectively, differ from one another by 2Id. The currents in the input and output branches of the mirror Sp2 are equal to Ip4. The current in the output branch of the mirror Sp3 is equal to Ip5.

The injection of the current thus obtained into node N of the circuit of FIG. 2 with the use of two resistors Ro as compensation-voltage generators having the same resistance as the resistor R1 adds to or subtracts from the voltages Vgs of the two transistors Mn and Mp a voltage rendering the drain currents of the two transistors equal to one another. In other words, this compensates for any differences between the Vgs voltages of the two transistors.

If the transistors Mp1 and Mn1 are not identical to the transistors Mp and Mn to be compensated but, for example, have different dimensions, it is necessary to select resistors Ro to achieve the desired compensation. The resistances Ro have resistances proportional to that of the resistor R1 with a proportionality factor dependent on the ratios between the dimensions of the transistors to be compensated and those of the transistors Mn1 and Mp1 of the compensation circuit 10. This also takes into account the currents and the current ratios of the current mirrors.

With the same circuit 10 or with a circuit similar thereto, it is also possible to compensate the gate-source voltages of n-channel and p-channel transistors in circuit configurations other than that shown in FIG. 2. For example, as shown in FIGS. 4a and 4b, the transistors Mn' and Mp' may have their gate electrodes connected to their drain electrodes and may be biased by respective generators Gn and Gp connected between their drain electrodes and respective voltage references Vdd and ground.

The compensation current Io is injected into the drain electrode of the respective transistor Mn', Mp' via a resistor Ro'. If the transistors Mn' and Mp' are identical to the transistors Mn1 and Mp1, respectively, compensation is achieved with the use of resistors Ro' having the same resistance as the resistor R1. Otherwise, the resistance value is selected to be proportional to that of the resistor R1 with a proportionality factor which depends on the ratio between the dimensions of the transistors Mn' and Mp' to be compensated and those of the transistors Mn1 and Mp1 of the circuit 10. The compensated voltages Vn and Vp are given by the sum of the gate-source voltages Vgsn and Vgsp of the transistors Mn' and Mp', respectively, and by the voltage drop in the resistors Ro'.

Figure 4A:
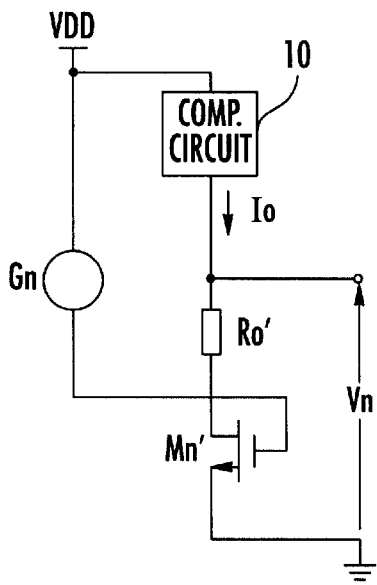
FIGS. 4a and 4b show two applications of the compensation circuit according to the present invention.
Figure 4B:
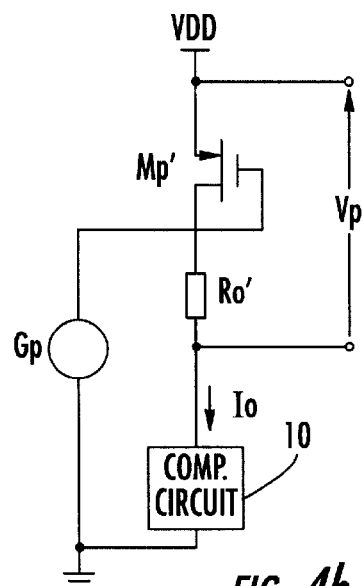
Figure 5:
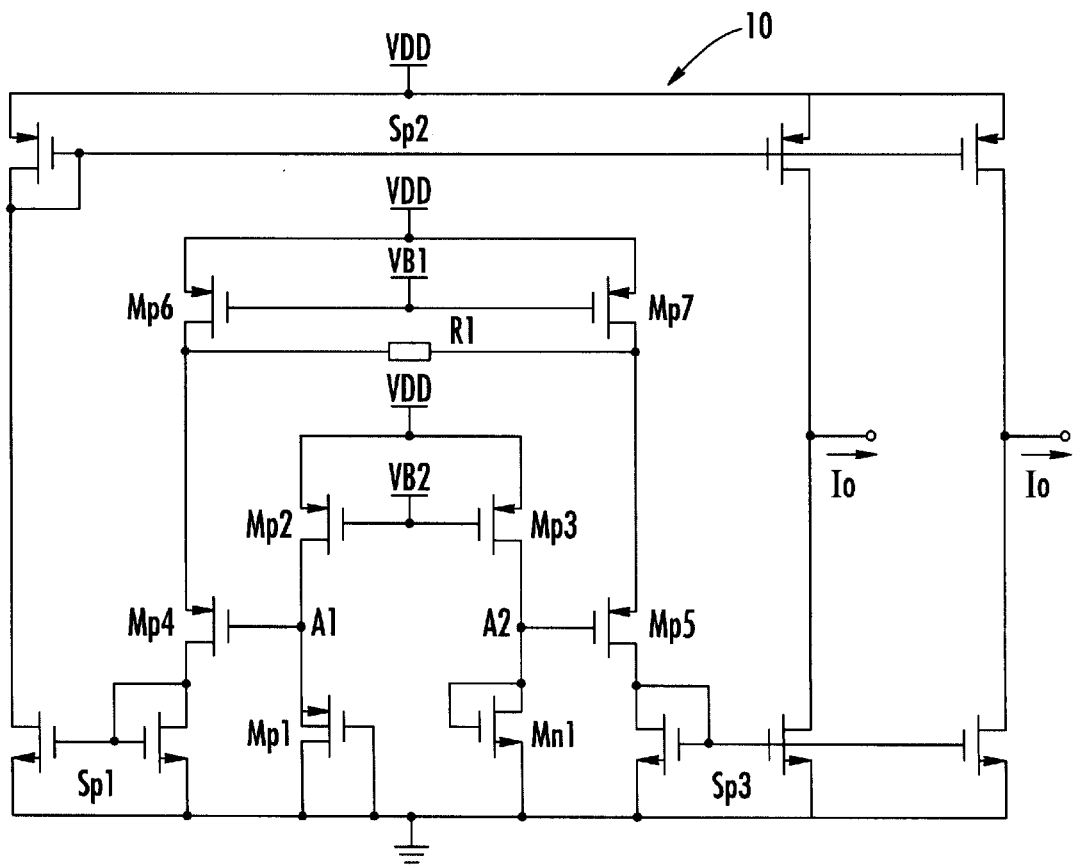
FIG. 5 shows a variation of the compensation circuit illustrated in FIG. 3.

If the transistors to be compensated belong to separate circuits, as shown in FIGS. 4a and 4b, the mirrors Sp2 and Sp3 should have two separate output branches, as shown in FIG. 5. Moreover, if there are more than two transistors to be compensated it may be necessary to modify the current mirrors Sp2 and Sp3 such that they have as many output branches as there are transistors to be compensated independently of one another.

Although only one embodiment of the invention has been described and illustrated, clearly many variations are possible within the scope of the same inventive concept. For example, instead of a resistor, another component such as a MOS transistor biased to the linear zone may be used as the compensation current generator.

That which is claimed is:

1. A compensation circuit for compensating a difference between gate-source voltages of first and second MOS transistors of an integrated circuit, the first MOS transistor having a first type of conductivity and the second MOS transistor having a second type of conductivity, the compensation circuit comprising:

third and fourth MOS transistors in the integrated circuit, said third MOS transistor having the first type of conductivity and said fourth MOS transistor having the second type of conductivity;

a bias circuit connected to said third and fourth MOS transistors for biasing thereof;

a measurement circuit for measuring a difference between gate-source voltages of said third and fourth transistors;

a current compensation circuit connected to said measurement circuit for generating a compensation current based upon the measured difference between the gate-source voltages of said third and fourth transistors; and a bias compensation circuit connected to said measurement circuit for modifying biasing of the first and second MOS transistors using the generated compensation current.

2. A compensation circuit according to claim 1, wherein the first MOS transistor comprises a p-channel MOS transistor and the second MOS transistor comprises an n-channel MOS transistor; and wherein said third MOS transistor comprises a p-channel MOS transistor and said fourth MOS transistor comprises an n-channel MOS transistor.

3. A compensation circuit according to claim 1, wherein said bias circuit comprises:
   a first current generator connected in series with said third MOS transistor; and
   a second current generator connected in series with said third fourth MOS transistor.

4. A compensation circuit according to claim 1, wherein said measurement circuit comprises:
   a first decoupling stage having an input connected to a source of said third MOS transistor, and an output connected to said current compensation circuit; and
   a second decoupling stage having an input connected to a drain of said fourth MOS transistor, and an output connected to said current compensation circuit.

5. A compensation circuit according to claim 4, wherein said bias compensation circuit comprises:
   a first current mirror having an input connected to said first decoupling stage;
   a second current mirror having an input connected to an output of said first current mirror; and
   a third mirror having an input connected to said second decoupling stage and an output connected to an output of said second current mirror.

6. A compensation circuit according to claim 5, wherein the integrated circuit further includes a voltage compensation circuit for generating a compensation voltage to add to or subtract from the gate-source voltages of the first and second MOS transistors so that respective drain currents thereof are equal, the voltage compensation circuit being connected between the output of said third current mirror and gates of the first and second MOS transistors.

7. A compensation circuit according to claim 6, wherein the voltage compensation circuit comprises two resistors connected in series.

8. A compensation circuit according to claim 1, wherein the first MOS transistor comprises a p-channel MOS transistor including a gate and a drain connected together, and the second MOS transistor comprises an n-channel MOS transistor including a gate and a drain connected together.

9. A compensation circuit according to claim 6, wherein said current compensation circuit comprises a resistor.

10. An integrated circuit device comprising:
    a first MOS transistor having a first type of conductivity and a second MOS transistor having a second type of conductivity;
    a compensation circuit for compensating a difference between gate-source voltages of said first and second MOS transistors, said compensation circuit comprising:
       a third MOS transistor having the first type of conductivity and a fourth MOS transistor having the second type of conductivity, a bias circuit connected to said third and fourth MOS transistors for biasing thereof,
       a measurement circuit for measuring a difference between gate-source voltages of said third and fourth transistors,
       a current compensation circuit connected to said measurement circuit for generating a compensation current based upon the measured difference between the gate-source voltages of said third and fourth transistors, and
       a bias compensation circuit connected to said measurement circuit for modifying biasing of the first and second MOS transistors using the generated compensation current; and
    a voltage compensation circuit connected to said bias compensation circuit and said first and second MOS transistors for generating a compensation voltage to add to or subtract from the gate-source voltages of said first and second MOS transistors so that respective drain currents thereof are equal.

11. An integrated circuit device according to claim 10, wherein said first MOS transistors comprises a p-channel MOS transistor and said second MOS transistor comprises an n-channel MOS transistor; and wherein said third MOS transistor comprises a p-channel MOS transistor and said fourth MOS transistor comprises an n-channel MOS transistor.

12. An integrated circuit device according to claim 10, wherein said bias circuit comprises:
    a first current generator connected in series with said third MOS transistor; and
    a second current generator connected in series with said third fourth MOS transistor.

13. An integrated circuit device according to claim 10, wherein said measurement circuit comprises:
    a first decoupling stage having an input connected to a source of said third MOS transistor, and an output connected to said current compensation circuit; and
    a second decoupling stage having an input connected to a drain of said fourth MOS transistor, and an output connected to said current compensation circuit.

14. An integrated circuit device according to claim 13, wherein said bias compensation circuit comprises:
    a first current mirror having an input connected to said first decoupling stage;
    a second current mirror having an input connected to an output of said first current mirror; and
    a third mirror having an input connected to said second decoupling stage and an output connected to an output of said second current mirror.

15. An integrated circuit device according to claim 10, wherein said voltage compensation circuit is connected between the output of said third current mirror and gates of said first and second MOS transistors.

16. An integrated circuit device according to claim 10, wherein said voltage compensation circuit comprises two resistors connected in series.

17. An integrated circuit device according to claim 10, wherein said first MOS transistor comprises a p-channel MOS transistor including a gate and a drain connected together, and said second MOS transistor comprises an n-channel MOS transistor including a gate and a drain connected together.

18. An integrated circuit device according to claim 10, wherein said current compensation circuit comprises a resistor.

19. A method for compensating a difference between gate-source voltages of first and second MOS transistors of an integrated circuit, the first MOS transistor having a first type of conductivity and the second MOS transistor having a second type of conductivity, the method comprising:

biasing third and fourth MOS transistors in the integrated circuit, the third MOS transistor having the first type of conductivity and the fourth MOS transistor having the second type of conductivity;

measuring a difference between gate-source voltages of the third and fourth MOS transistors;

generating a compensation current based upon the measured difference between the gate-source voltages of the third and fourth MOS transistors; and modifying biasing of the first and second MOS transistors using the generated compensation current.

20. A method according to claim 19, wherein the first MOS transistors comprises a p-channel MOS transistor and the second MOS transistor comprises an n-channel MOS transistor; and wherein the third MOS transistor comprises a p-channel MOS transistor and the fourth MOS transistor comprises an n-channel MOS transistor.

21. A method according to claim 19, wherein biasing comprises:

generating a first current to be applied to the third MOS transistor; and generating a second current to be applied to the fourth MOS transistor.

22. A method according to claim 19, wherein measuring comprises:

using a first decoupling stage having an input connected to a source of the third MOS transistor, and an output connected to the current compensation circuit; and using a second decoupling stage having an input connected to a drain of the fourth MOS transistor, and an output connected to the current compensation circuit.

23. A method according to claim 22, wherein modifying biasing comprises:

mirroring an output current of the first decoupling stage; and mirroring an input current of the second decoupling stage.

24. A method according to claim 19, further comprising generating a compensation voltage to add to or subtract from the gate-source voltages of the first and second MOS transistors so that respective drain currents are equal.

25. A method according to claim 24, wherein generating the compensation voltage is performed using a voltage compensation circuit comprising two resistors connected in series.

26. A method according to claim 19 wherein the first MOS transistor comprises a p-channel MOS transistor including a gate and a drain connected together, and the second MOS transistor comprises an n-channel MOS transistor including a gate and a drain connected together.

* * * * *

UNITED STATES PATENT AND TRADEMARK OFFICE
CERTIFICATE OF CORRECTION

PATENT NO.   : 6,448,839 B1
DATED        : September 10, 2002
INVENTOR(S)  : Luciano Tomasini and Jesus Guinea It is certified that error appears in the above-identified patent and that said Letters Patent is hereby corrected as shown below:

<u>Title page,</u>
Item [30], Foreign Application Priority Data, insert
-- [30]    Foreign Application Priority Data
           Oct. 21, 1999 (EP) ...............................99830662 --

<u>Column 5,</u>
Line 15, delete "third fourth" insert -- fourth --

<u>Column 6,</u>
Line 15, delete "MOS transistors" insert -- MOS transistor --
Line 26, delete "third fourth" insert -- fourth --

<u>Column 7,</u>
Line 13, delete "MOS transistors" insert -- MOS transistor --

Signed and Sealed this

First Day of April, 2003

JAMES E. ROGAN
*Director of the United States Patent and Trademark Office*